United States Patent
Pang et al.

(10) Patent No.: US 8,917,138 B2
(45) Date of Patent: Dec. 23, 2014

(54) NOISE FILTERING CIRCUIT AND OPERATING METHOD THEREOF

(71) Applicant: Samsung Electro-Mechanics Co., Ltd., Suwon, Gyunggi-do (KR)

(72) Inventors: Sung Man Pang, Gyunggi-do (KR); Chang Jae Heo, Gyunggi-do (KR)

(73) Assignee: Samsung Electro-Mechanics Co., Ltd., Suwon-Si (KR)

( * ) Notice: Subject to any disclaimer, the term of this patent is extended or adjusted under 35 U.S.C. 154(b) by 0 days.

(21) Appl. No.: 13/774,634

(22) Filed: Feb. 22, 2013

(65) Prior Publication Data

US 2014/0152367 A1 Jun. 5, 2014

(30) Foreign Application Priority Data

Dec. 5, 2012 (KR) .................. 10-2012-0140174

(51) Int. Cl.
*H03K 5/00* (2006.01)
*H03K 5/1252* (2006.01)

(52) U.S. Cl.
CPC .................... *H03K 5/1252* (2013.01)
USPC ........................... 327/558; 327/552

(58) Field of Classification Search
USPC ............................ 327/551–559, 34
See application file for complete search history.

(56) References Cited

U.S. PATENT DOCUMENTS

| 6,507,221 B2 * | 1/2003 | La Rosa ................... 327/34 |
| 6,535,024 B1 * | 3/2003 | Rochard .................. 327/34 |
| 7,830,181 B1 * | 11/2010 | Huang et al. ............. 327/34 |
| 2003/0151964 A1 | 8/2003 | Takahashi et al. |

FOREIGN PATENT DOCUMENTS

KR 1998-0030524 4/1999
KR 102003002855 4/2003

OTHER PUBLICATIONS

Korean Office Action issued in Korean Application No. 10-2012-0140174 dated Feb. 18, 2014, w/English translation.

* cited by examiner

*Primary Examiner* — Dinh Le
(74) *Attorney, Agent, or Firm* — McDermott Will & Emery LLP (57) ABSTRACT

There are provided a noise filter circuit and an operating method thereof. A noise filter circuit includes a first delay circuit, and a second delay circuit connected to the first delay circuit in series, wherein the first delay circuit and the second delay circuit each include at least one inverter and at least one delay element for generating a predetermined delay, and the first delay circuit and the second delay circuit have different filtering characteristics.

9 Claims, 7 Drawing Sheets

NOISE FILTERING CIRCUIT AND OPERATING METHOD THEREOF

CROSS-REFERENCE TO RELATED APPLICATIONS

This application claims the priority of Korean Patent Application No. 10-2012-0140174 filed on Dec. 5, 2012, in the Korean Intellectual Property Office, the disclosure of which is incorporated herein by reference.

BACKGROUND OF THE INVENTION

1. Field of the Invention

The present invention relates to a noise filtering circuit including a plurality of delay circuits connected to each other in series and filtering low-level noise included in a high-level input signal and high-level noise included in a low-level input signal in each of the plurality of delay circuits connected to each other in series to be able to effectively filter two types of noise signals, and an operating method thereof.

2. Description of the Related Art

A technology of filtering noises included in an input signal is essential to secure stability of the overall circuit and obtain a required output signal and has been widely applied to various types of circuits. In particular, a technology of filtering a high-level noise signal overlapping a low-level input signal and a low-level noise signal overlapping a high-level input signal, to be separate from a normal input signal, is very important to obtain a stable output signal.

A noise filter circuit according to the related art branches one input signal to generate two input signals having different phases and transmits the generated steady-phase input signal and a negative phase input signal, respectively, to independent delay circuits to carry out turn-on filtering and turn-off filtering. The noise filter circuit may filter high-level noise included in a low-level input signal in the turn-on filtering operation and low-level noise included in a high-level input signal in the turn-off filtering operation.

The result signal of the turn-on filtering and the result signal of the turn-off filtering are input to a flip flop such as an RS latch. Consequently, a separate flip flop is necessarily connected to a later stage of the turn-on filtering circuit and the turn-off filtering circuit, such that the overall circuit configuration may be complicated and costs may be increased accordingly.

The Related Art Document below relates to a semiconductor memory device and a control method thereof and includes a buffer receiving an input signal, a noise filter circuit, and a latch to carry out a turn-on filtering. However, like the related art introduced earlier, the Related Art Document below requires a latch essentially connected to a later stage of the turn-on filtering circuit, and therefore does not disclose a noise filter circuit capable of carrying out both of the turn-on filtering and the turn-off filtering without the latch.

RELATED ART DOCUMENT

Korean Patent Laid-Open Publication No. KR 10-2003-0028550

SUMMARY OF THE INVENTION

An aspect of the present invention is to provide a noise filtering circuit and an operating method thereof, in which a first delay circuit and a second delay circuit are connected to each other in series to allow the first delay circuit to filter high-level noise included in a low-level input signal and the second delay circuit to filter low-level noise included in a high-level input signal. Thus, a first delay circuit and a second delay circuit are connected to each other in series to carry out turn-on filtering and turn-off filtering, thereby generating a filtered output signal having the same pulse width as an original input signal without a separate latch.

According to an aspect of the present invention, there is provided a noise filter circuit, including: a first delay circuit; and a second delay circuit connected to the first delay circuit in series, wherein the first delay circuit and the second delay circuit each include at least one inverter and at least one delay element for generating a predetermined delay and the first delay circuit and the second delay circuit have different filtering characteristics.

The first delay circuit may filter noise occurring while an input signal is turned-on from a low level to a high level, and the second delay circuit may filter the noise occurring while the input signal is turned-off from a high level to a low level.

The first delay circuit may filter as the noise the input signal turned-on from a low level to a high level for a predetermined reference time or less, and the second delay circuit may filter as the noise the input signal turned-off from a high level to a low level for the predetermined reference time or less.

The at least one delay element may include at least one capacitor and a charge supply source charging charges in the capacitor.

The capacitor included in the first delay circuit may have a discharging time shorter than a charging time and the capacitor included in the second delay circuit may have a charging time shorter than a discharging time.

The charge supply source may include at least one switching unit and an operation of the switching unit may be controlled by inverse signals of the input signals that are input to the first delay circuit and the second delay circuit, respectively.

The first delay circuit and the second delay circuit may have the same circuit structure.

According to another aspect of the present invention, there is provided an operating method of a noise filter circuit, including: receiving an input signal; charging charges in a capacitor when a level of the input signal is changed from a low level to a high level; and determining a signal output from an inverter connected to the capacitor, based on a first time during which the input signal is maintained at a high level and a second time required to change the voltage of the capacitor to a threshold voltage of an inverter connected to the capacitor.

In the determining, the level of the signal output from the inverter connected to the capacitor may be determined as having a low level when the first time is shorter than the second time.

In the determining, the level of the signal output from the inverter connected to the capacitor may be determined as having a high level when the first time is longer than the second time.

The operating method of a noise filter circuit may further include: generating a final output signal by inverting the level of the signal output from the inverter connected to the capacitor.

According to another aspect of the present invention, there is provided an operating method of a noise filter circuit, including: receiving an input signal; inverting the input signal to generate a first signal; and determining a level of a signal output from an inverter connected to the capacitor, based on a first time during which the first signal is maintained at a high level and a second time required to change the voltage of the capacitor of which the charging or the discharging is determined by the first signal, to a threshold voltage of an inverter connected to the capacitor.

In the determining, the level of the signal output from the inverter may be determined as having a high level when the first time is shorter than the second time.

In the determining, the level of the signal output from the inverter may be determined as having a low level when the first time is longer than the second time.

The generating of the first signal may include: discharging charges charged in an input stage capacitor connected to a switching unit operated by the input signal when the input signal is changed from a high level to a low level; charging charges in the input stage capacitor when the input signal is re-changed from a low level to a high level; and generating the first signal from the voltage of the input stage capacitor.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

Figure 1:
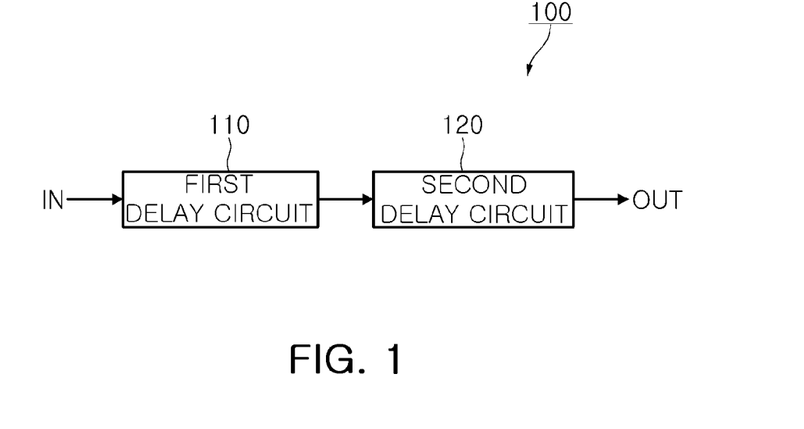
FIG. 1 is a block diagram schematically illustrating a noise filter circuit according to an embodiment of the present invention.

FIG. 1 is a block diagram schematically illustrating a noise filter circuit according to an embodiment of the present invention.

Referring to FIG. 1, a noise filter circuit 100 according to an embodiment of the present invention includes a first delay circuit 110 and a second delay circuit 120 that are connected to each other in series. An input signal IN input to the first delay circuit 110 is converted into an output signal OUT via the first delay circuit 110 and the second delay circuit 120 and may be turn-on filtered and turn-off filtered through the first and second delay circuits 110 and 120.

Hereinafter, the term "turn-on filtering" used throughout the present specification may refer to an operation of filtering a high-level noise signal from an input signal IN when a low-level input signal IN includes a high-level noise signal. Similarly, the term "turn-off filtering" may refer to an operation of filtering a low-level noise signal from the input signal IN when a low-level noise signal is included in the high-level input signal IN.

The first delay circuit 110 and the second delay circuit 120 may each include at least one inverter and at least one delay element for generating a predetermined delay. In addition, the first delay circuit 110 and the second delay circuit 120 may have different filtering characteristics. For example, the first delay circuit 110 may carry out the turn-on filtering operation of removing the high-level noise signal included in the input signal IN and the second delay circuit 120 may carry out the turn-off filtering operation of removing the low-level noise signal included in the input signal IN. The first delay circuit 110 and the second delay circuit 120 may carry out an filtering operation having different characteristics to generate an output signal OUT having the same pulse width as the input signal IN without a flip flop.

At least one delay element included in the first delay circuit 110 and the second delay circuit 120, respectively, may include a capacitor in or from which charges are charged or discharged according to operation conditions of a circuit and, a charge supply source controlling a charging and discharging operation of the capacitor. The charge supply source may be configured to include a predetermined current source and a switching unit or a voltage source, a resistor, and a switching unit. In this case, the operation of the voltage supply source may be controlled by turning the switching unit on or off, and turning the switching unit on or off may be determined according to the input signal IN or a level of a signal output from the first delay circuit 110. Hereinafter, various embodiments of a configuration of the noise filter circuit 100 according to the embodiment of the present invention will be described with reference to FIGS. 2 through 4.

Figure 2:
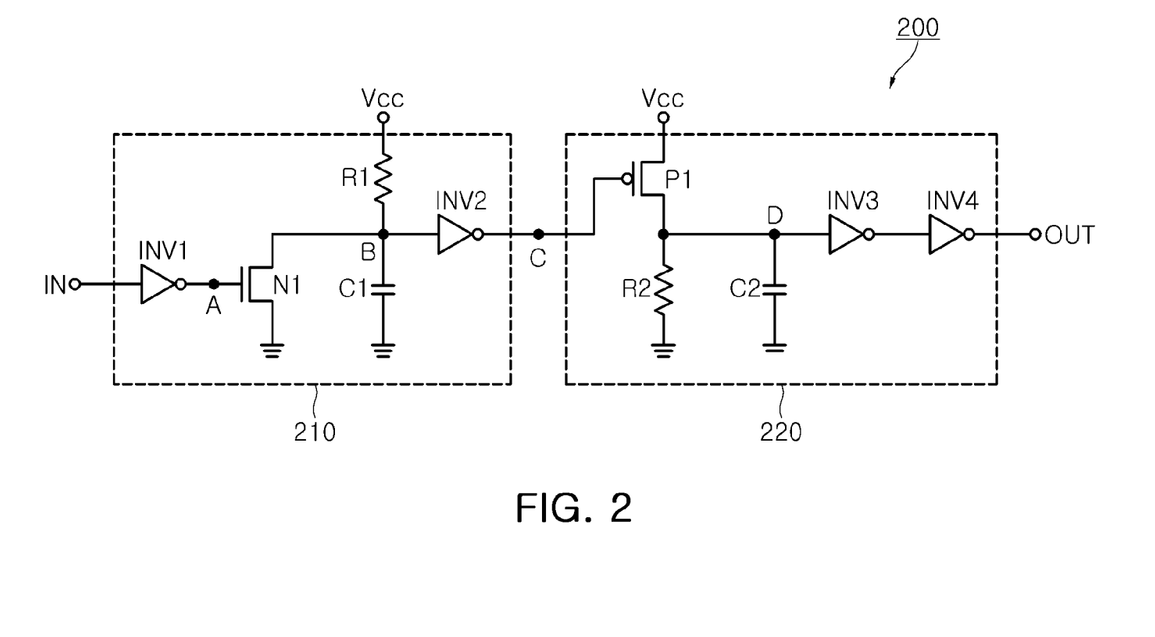
FIGS. 2 through 4 are circuit diagrams illustrating a configuration of the noise filter circuit according to the embodiment of the present invention.
Figure 3:
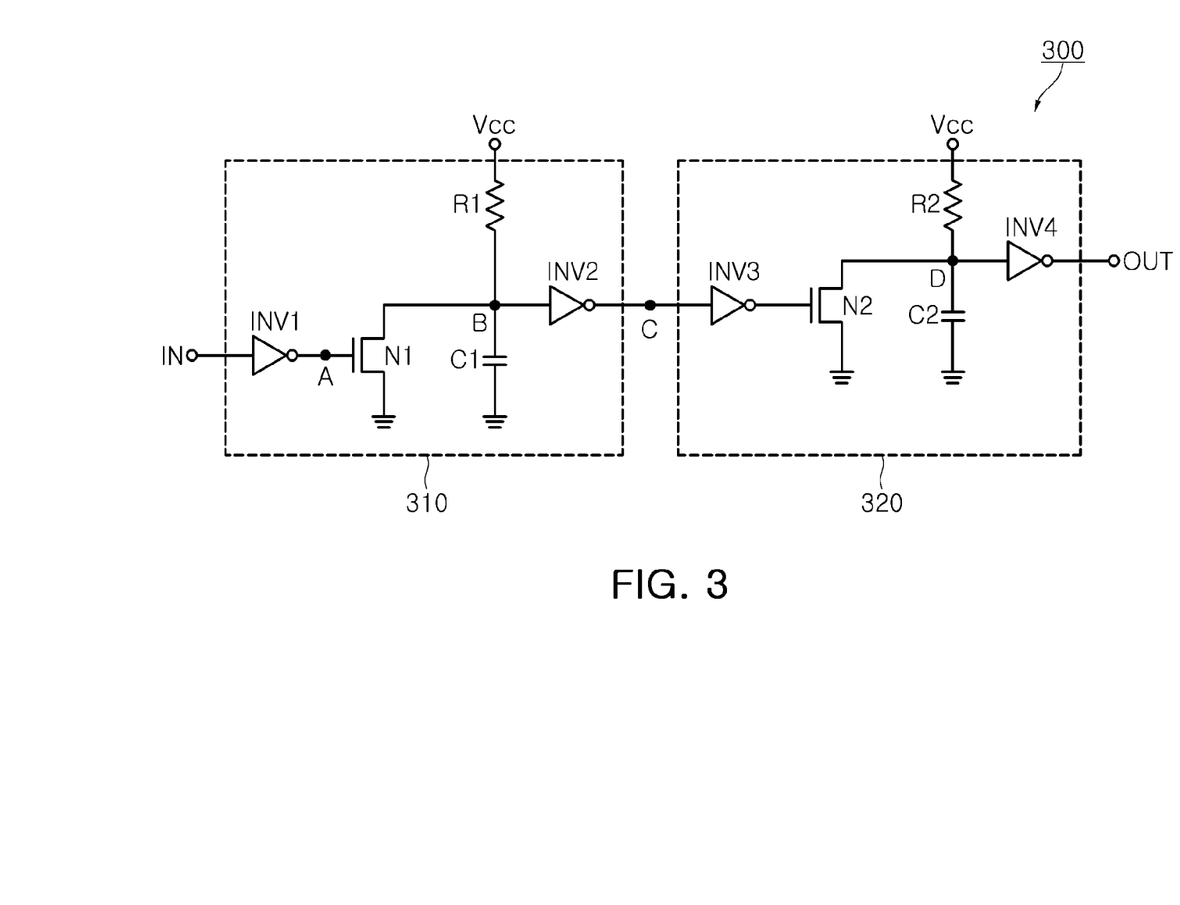
Figure 4:
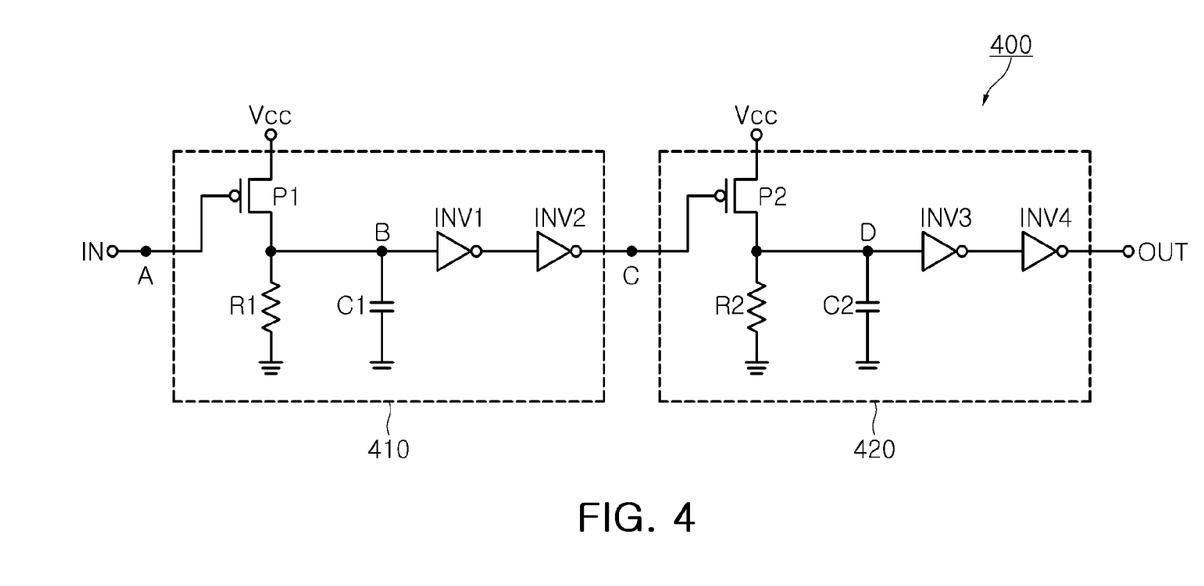

FIGS. 2 through 4 are circuit diagrams illustrating a configuration of the noise filter circuit according to the embodiment of the present invention.

Referring to FIG. 2, a noise filter circuit 200 according to the embodiment of the present invention includes a first delay circuit 210 and a second delay circuit 220 connected to each other in series and applies an input signal IN to an input terminal of the first delay circuit 210. The first delay circuit 210 may carry out a turn-on filtering operation and the second delay circuit 220 may carry out a turn-off filtering operation.

As described above, the first delay circuit 210 and the second delay circuit 220 each include at least one inverter and at least one delay element. Referring to FIG. 2, the first delay circuit 210 includes inverters INV1 and INV2 and the second delay circuit 220 includes inverters INV3 and INV4. Further, the first delay circuit 210 includes a delay element configured of a switching unit N1, a capacitor C1, and a resistor R1 connected to a voltage source Vcc, and the second delay circuit 220 includes a delay element configured of a switching unit P1 connected to a voltage source Vcc, a capacitor C2, and a resistor R2.

The delay elements included in each of the first and second delay circuits 210 and 220 may also be configured of a circuit different from FIG. 2. For example, in the first delay circuit 210, voltage output from the voltage source Vcc passes through the resistor R1 to charge charges in the capacitor C1, or the voltage source Vcc and the resistor R1 may be substituted with one current source. Alternatively, the same delay element may be applied to the first delay circuit 210 and the second delay circuit 220.

Hereinafter, the operation of the noise filter circuit 200 illustrated in FIG. 2 will be described with reference to graphs of FIGS. 5 through 7. The overall operating method of the noise filter circuit 200 will be described with reference to the graph of FIG. 5.

Figure 5:
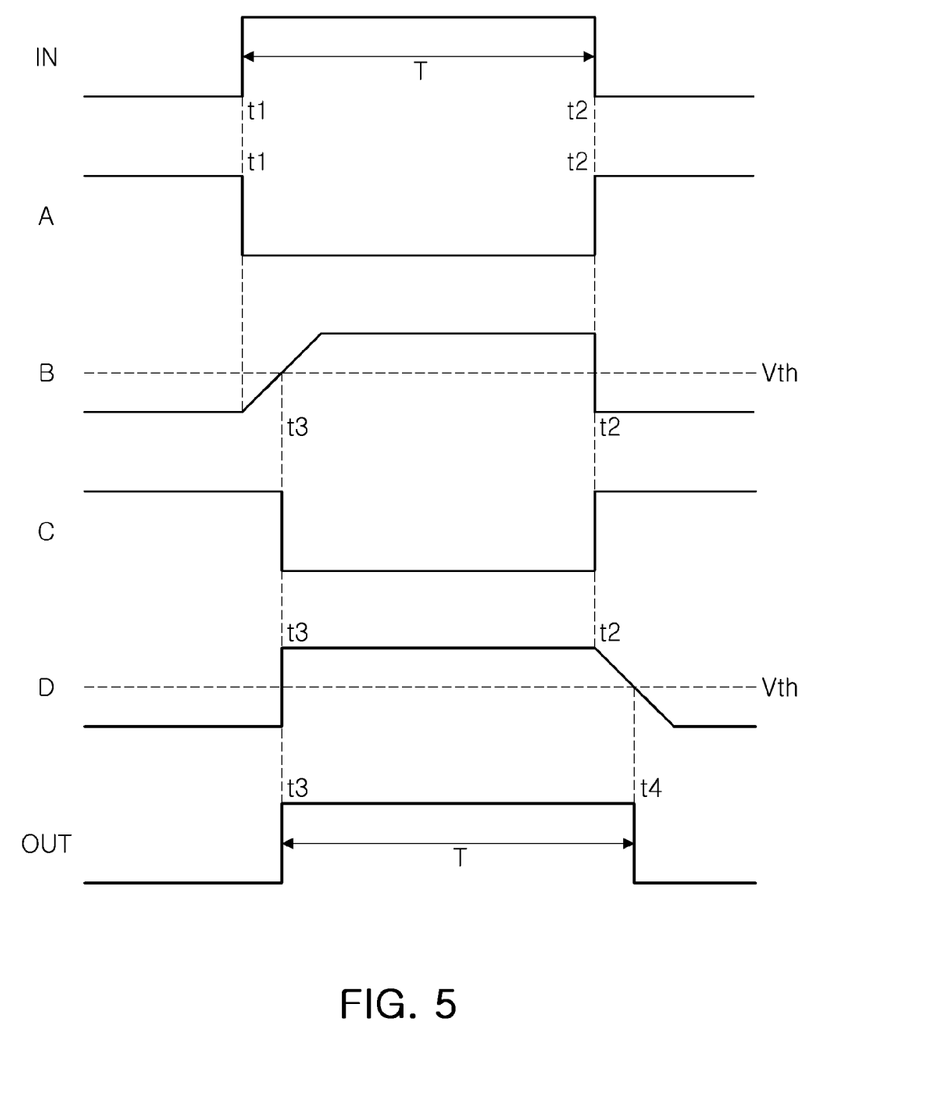
FIGS. 5 through 7 are graphs for describing an operating method of a noise filter circuit according to another embodiment of the present invention.

Referring to FIG. 5, the input signal IN is increased from a low level to a high level at t1 and is re-reduced to a low level at t2. The time during which the input signal is in a high level is T, and therefore an inversion signal of which the phase is opposite to that of the input signal IN is output from an output node A of the inverter INV1 of the first delay circuit 210 receiving the input signal IN.

When a signal of a node A is at a high level, the switching unit N1 is turned-on, and therefore all the current generated by the voltage source Vcc and the resistor R1 flows into the switching unit N1, such that charges are not charged in the capacitor C1. However, when the input signal IN is increased to a high level and thus the signal of the node A is changed to a low level, the switching unit N1 is turned-off, such that charges are charged in the capacitor C1 from t1 and the voltage of a node B starts to increase.

When the voltage of the node B is increased and thus exceeds a threshold voltage Vth of the inverter INV2, a signal of a node C that is an output terminal of the inverter INV2 is changed from a high level to a low level. In this case, the signal of the node C has the same form as the signal of the node A, but includes a delay by as much as t3–t1. The switching unit P1 is turned-on at t3 while the signal of the node C is changed from a high level to a low level and the output voltage of the voltage source Vcc connected to the switching unit P1 is applied to a resistor R2 and a capacitor C2. Therefore, charges are charged in the capacitor C2 and a signal level of a node D is rapidly increased from a low level to a high level due to a significantly reduced delay time. Therefore, the output signal OUT via the inverters INV3 and INV4 is also increased from a low level to a high level at time t3.

A signal of a node D continuously has a high level up to t2 when the signal of the node C has a low level, and when the signal of the node C is re-increased to a high level, the switching unit P1 is turned-off. Therefore, the charges charged in the capacitor C2 are discharged through the resistor R2 and the signal level of the node D starts to decline from t2. When the signal level of the node D is reduced and thus is smaller than a threshold voltage Vth of the inverter INV3, the output signal of the inverter INV3 is increased to a high level, such that the output signal OUT is reduced from a high level to a low level at time t4.

That is, in the overall operating method, the first delay circuit 210 slowly charges the capacitor C1 and rapidly discharges the capacitor C1, and the second delay circuit 220 rapidly charges the capacitor C2 and slowly discharges the capacitor C2. Therefore, as illustrated in FIG. 5, the output signal OUT is delayed by as much as t3–t1 and has the same holding time T at a high level, as compared with the input signal IN.

Hereinafter, operations of the turn-on filtering and the turn-off filtering of the noise filter circuit 200 illustrated in FIG. 2 will be described with reference to FIGS. 6 and 7.

Figure 6:
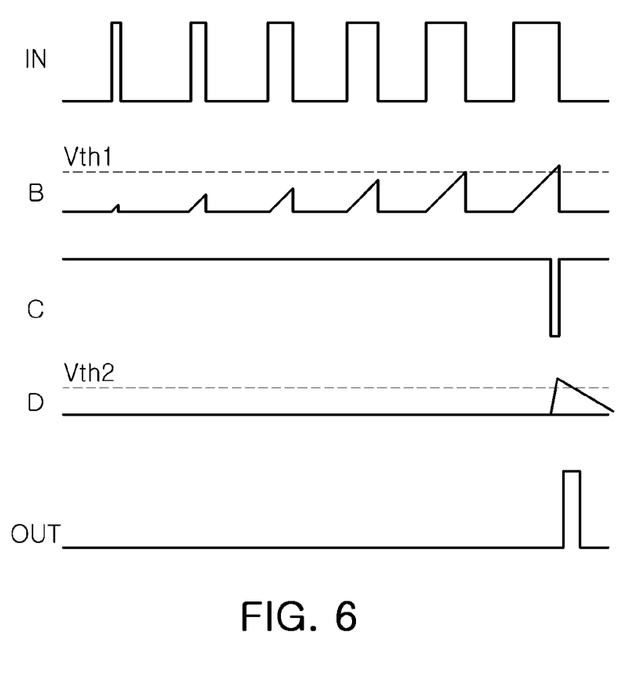

Referring first to FIG. 6, the input signal IN has a low level and has a section in which the input signal IN is changed to high level six times in total. In this case, all the input signals IN changed to a high level five times from the front are filtered as a noise component and the turn-on filtering operation is executed by the first delay circuit 210.

When the high-level noise component having a relatively short holding time (hereinafter, a first time) is included in the received low-level input signal IN, the signal maintained at a low level by as much as the first time is output from the node A. Therefore, the switching unit N1 is turned-off for the first time, such that charges are charged in the capacitor C1 and the signal level of the node B is increased.

However, since the first time is relatively very short time, the signal level of the node B does not increase to a threshold voltage Vth1 of the inverter INV2 connected to the capacitor C1, only with the charges charged in the capacitor C1 for the first time. That is, when the capacitor C1 is charged and thus the time required to increase the signal level of the node B up to the threshold voltage Vth1 of the inverter INV2 is defined as a second time, the first time corresponds to a case shorter than the second time.

Therefore, the signal level of the node C that is the output terminal of the inverter INV2 is maintained at a high level as it is, the switching unit P1 is continuously turned-off, and the output signal OUT is maintained at a low level. Consequently, the noise component having a high level for the first time does not affect the output signal OUT, and therefore the first delay circuit 210 carries out the turn-on filtering.

On the other hand, in the graph of the input signal IN of FIG. 6, describing the section in which the input signal is changed to a high level at the sixth, the first time during which the high level is maintained is sufficiently long. Therefore, since the first time is longer than the second time, the signal level of the node B exceeds the threshold voltage Vth1 of the inverter INV2 due to the charges charged in the capacitor C1. Therefore, when the signal level of the node C is changed from a high level to a low level, the switching unit P1 is turned-on, and thus the capacitor C2 is instantaneously charged, such that the signal level of the node D exceeds a threshold voltage Vth2 of the inverter INV3.

When the level of the input signal IN is re-reduced to the low level, the switching unit N1 is turned-on and thus the charges charged in the capacitor C1 are rapidly discharged, such that the signal level of the node B is smaller than the threshold voltage Vth1 of the inverter INV2. Therefore, the signal level of the node C is re-increased to a high level and the switching unit P1 is turned-off, and therefore the charges charged in the capacitor C2 are slowly discharged, such that the signal level of the node D is smaller than the threshold voltage Vth2 of the inverter INV3. Consequently, the level of the output signal OUT is re-reduced to the low level to generate the output signal OUT having the same form as the input signal IN and a predetermined delay.

Next, the turn-off filtering operation will be described with reference to FIG. 7. It is assumed that the input signal IN has a high level and a signal component having a low level six times in total is included in the input signal IN.

First, describing the case in which the input signal IN held as a low level for the very short holding time (hereinafter, defined as the first time) is applied, the signal level of the node A is increased from a low level to a high level as the input signal IN is changed to a low level. Therefore, the turned-off switching unit N1 is turned-on for the first time, and the charges charged in the capacitor C1 while the switching unit N1 is the turned-off are rapidly discharged, such that the signal level of the node B is reduced from a high level to a low level. In this case, the signal of the node C that is the output terminal of the inverter INV2 is increased from a low level to a high level.

Therefore, the turned-on switching unit P1 is turned-off and the charges charged in the capacitor C2 while the switching unit P1 is turned-on are slowly discharged, such that the signal level of the node D starts to decline. However, as illustrated in FIG. 7, the first time is very short time, and therefore the first time is smaller than the time (hereinafter, defined as the second time) required to discharge the capacitor C2 so as to allow the signal level of the node D to be smaller than the threshold voltage Vth2 of the inverter INV3. Therefore, the output signal OUT is maintained at a high level as it is.

Figure 7:
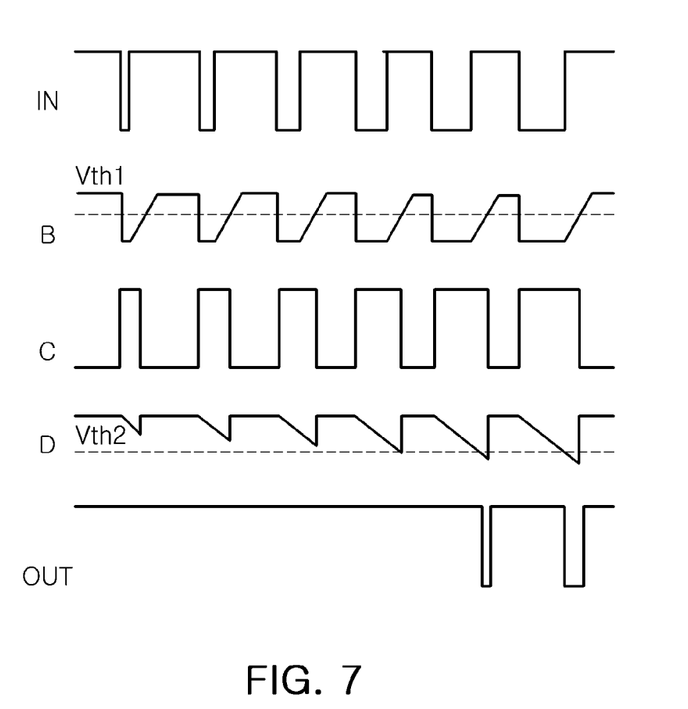

Meanwhile, when the first time is longer than the second time, describing fifth and sixth sections in which the input signal IN is changed to a low level in FIG. 7, the switching unit P1 is continuously turned-off until the capacitor C2 is discharged and thus the signal level of the node D is smaller than the threshold voltage Vth2 of the inverter INV3. Therefore, like the input signal IN, the output signal OUT may be generated as a signal having a section in which the output signal OUT is changed from a high level to a low level, to effectively carry out the turn-off filtering operation in which the low-level input signal IN having the relatively very short holding time can only be filtered as the noise component.

FIGS. 3 and 4 are circuit diagrams illustrating noise filter circuits 300 and 400 according to another embodiment of the present invention. Referring to FIGS. 3 and 4, in the embodiments of the present invention, unlike the noise filter circuit 200 illustrated in FIG. 2, first delay circuits 310 and 410 and second delay circuits 320 and 420 may have the same structure. Hereinafter, the turn-on filtering operation of FIG. 3 and the turn-off filtering operation of FIG. 4 will be described.

When the low-level input signal IN including the noise signal component maintained at the relatively high level is applied to the noise filter circuit 300 illustrated in FIG. 3 for the very short first time, the switching unit N1 is turned-off while the signal level of the node A is changed to a low level. Therefore, the charges are charged in the capacitor C1, such that the signal level of the node B is slowly increased.

However, as the input signal IN is not maintained at a high level until the second time required to increase the signal level of the node B so as to exceed the threshold voltage of the inverter INV2 lapses, that is, the first time is shorter than the second time, the signal of the node C that is the output terminal of the inverter INV2 is continuously maintained at a high level. Therefore, the output signal of the inverter INV3 has a low level and the switching unit N2 is continuously turned-off, and thus the charges charged in the capacitor C2 are not discharged.

Consequently, the signal level of the node D is a high level and the inverter INV4 continuously outputs the low-level signal, such that the output signal OUT is maintained at a low level. The signal component changed to a high level for the relatively very short first time in the input signal IN is filtered as noise, and thus does not affect the output signal OUT, such that it may be appreciated that the turn-on filtering is effectively carried out.

Next, the turn-off filtering operation method of the noise filter circuit 400 will be described under the assumption that the high-level input signal IN including the noise signal component maintained at a low level is applied to the noise filter circuit 400 illustrated in FIG. 4 for the very short first time. When the high-level input signal IN is changed to a low level for the first time, the switching unit P1 is turned-on, such that the charges are rapidly charged in the capacitor C1 and the signal level of the node B is increased to a high level. Consequently, the signal level of the node C that is the output terminal of the first delay circuit 410 is also increased to a high level.

As the signal level of the node C is increased to a high level, the switching unit P2 is turned-off. Therefore, the charges charged in the capacitor C2 are slowly discharged while the switching unit P2 is turned-on. When the second time required to discharge the charges charged in the capacitor C2 so as to allow the signal level of the node D to be lower than the threshold voltage of the inverter INV3 is longer than the first time, the output signal of the inverter INV3 is maintained at a low level as it is. Consequently, the signal level of the output signal OUT is maintained at a high level as it is, and the low-level noise component for the first time appearing in the input signal IN is turn-off filtered, and thus does not affect the output signal OUT.

As set forth above, according to the embodiments of the present invention, the first delay circuit may carry out the turn-on filtering and the second delay circuit connected to the first delay circuit in series may carry out the turn-off filtering. In particular, according to the embodiments of the present invention, the complexity of the circuit may be reduced and increases in costs may be prevented by generating an output signal having the same pulse width as the original input signal without connecting the separate latch with the later stage of the filtering circuit.

While the present invention has been shown and described in connection with the embodiments, it will be apparent to those skilled in the art that modifications and variations may be made without departing from the spirit and scope of the invention as defined by the appended claims.

What is claimed is:

1. A noise filter circuit, comprising:
a first delay circuit; and
a second delay circuit connected to the first delay circuit in series,
wherein the first delay circuit and the second delay circuit each include at least one inverter and at least one delay element for generating a predetermined delay,
wherein the first delay circuit and the second delay circuit have different filtering characteristics,
wherein the at least one delay element includes at least one capacitor and a charge supply source charging charges in the capacitor, and
wherein the capacitor included in the first delay circuit has a discharging time shorter than a charging time and the capacitor included in the second delay circuit has a charging time shorter than a discharging time.

2. The noise filter circuit of claim 1, wherein the first delay circuit filters noise occurring while an input signal of the first delay circuit is changed from a low level to a high level, and the second delay circuit filters the noise occurring while an input signal of the second delay circuit is changed from a high level to a low level.

3. The noise filter circuit of claim 1, wherein the first delay circuit filters out noise occurring in an input signal of the first delay circuit and causing the input signal of the first delay circuit to change from a low level to a high level for a predetermined reference time or less, and
the second delay circuit filters out noise occurring in an input signal of the second delay circuit and causing the input signal of the second delay circuit to change from a high level to a low level for the predetermined reference time or less.

4. The noise filter circuit of claim 1, wherein the charge supply source includes at least one switching unit and an operation of the switching unit is controlled by inverse signals corresponding to inverted versions of an input signal of the first delay circuit and an input signal of the second delay circuit, respectively.

5. The noise filter circuit of claim 1, wherein the first delay circuit and the second delay circuit have the same circuit structure.

6. An operating method of a noise filter circuit, comprising:
receiving an input signal;
charging charges onto a capacitor using a flow of current through a switching unit when a level of the input signal is changed from a low level to a high level; and
determining a level of a signal output from an inverter connected to the capacitor, wherein the level of the signal output from the inverter is determined based on a first time during which the input signal is maintained at a high level, a second time required to change the voltage of the capacitor, and a threshold voltage of the inverter connected to the capacitor,
wherein in the determining, the level of the signal output from the inverter connected to the capacitor is determined as having a low level when the first time is shorter than the second time, and as having a high level when the first time is longer than the second time.

7. The operating method of claim 6, further comprising generating a final output signal by inverting the level of the signal output from the inverter connected to the capacitor.

8. An operating method of a noise filter circuit, comprising:
receiving an input signal;
inverting the input signal to generate a first signal, where the first signal is a voltage across a capacitor;
determining a level of a signal output from an inverter connected to the capacitor, wherein the level of the signal output from the inverter is determined based on a first time during which the first signal is maintained at a high level, a second time required to change the voltage of the capacitor of which the charging or the discharging is determined by the first signal, and a threshold voltage of the inverter connected to the capacitor,
wherein in the determining, the level of the signal output from the inverter is determined as having a high level when the first time is shorter than the second time, and as having a low level when the first time is longer than the second time.

9. The operating method of claim 8, wherein the generating of the first signal includes:
discharging charges stored in the capacitor using a switching unit connected to the capacitor, wherein the switching unit is operated by the input signal, when the input signal is changed from a high level to a low level;
charging charges onto the capacitor with a flow of current through the switching unit when the input signal is re-changed from a low level to a high level; and
generating the first signal from the voltage across the capacitor.

* * * * *